United States Patent [19]
Izawa et al.

[11] Patent Number: 6,005,761
[45] Date of Patent: Dec. 21, 1999

[54] OVERHEAT PROTECTION DEVICE, SEMICONDUCTOR SWITCH APPARATUS USING THE SAME, AND INTELLIGENT POWER MODULE

[75] Inventors: Takaaki Izawa; Tsuyoshi Uchikura, both of Shizuoka, Japan

[73] Assignee: Yazaki Corporation, Tokyo, Japan

[21] Appl. No.: 09/066,529

[22] Filed: Apr. 27, 1998

[30] Foreign Application Priority Data

Apr. 28, 1997 [JP] Japan ..................................... 9-111233

[51] Int. Cl.$^6$ ...................................................... H02H 5/00
[52] U.S. Cl. .............................. 361/103; 361/18; 361/115
[58] Field of Search ................................. 361/18, 23, 24, 361/25, 103, 115

[56] References Cited

U.S. PATENT DOCUMENTS 5,115,225  5/1992  Dao et al. ................................ 340/584

Primary Examiner—Stephen W Jackson
Attorney, Agent, or Firm—Armstrong, Westerman, Hattori, McClelland & Naughton

[57] ABSTRACT

An overheat protection device 10 that can perform the immediate resetting of the power cutoff control state or the power limit control state when the overheat state of the drive circuit (power MOSFET) is eliminated. A semiconductor switching apparatus and an intelligent power module 30 are also provided which use the overheat protection device 10. The overheat protection device 10 monitors the energized state of the drive circuit that drives the load 32; when it detects the overheat state of the drive circuit during the energized state, resets the energized state to limit or stop the driving of the load 32; holds the power limit control state or the power cutoff control state and monitors the overheat state in synchronism with the timing signal 102b having a predetermined cycle; and, when the absence of the overheat state is detected during the monitoring, generates the gate control signal 108a to reset the power limit control state or the power cutoff control state.

16 Claims, 4 Drawing Sheets

OVERHEAT PROTECTION DEVICE, SEMICONDUCTOR SWITCH APPARATUS USING THE SAME, AND INTELLIGENT POWER MODULE

BACKGROUND OF THE INVENTION (a) Field of the Invention

The present invention relates to a semiconductor apparatus and more specifically to an overheat protection device and a semiconductor switching apparatus using the overheat protection apparatus, and an intelligent power module.

In more concrete terms, this invention relates to a semiconductor switching apparatus, which has a drive circuit to drive a load according to a load drive instruction entered from an input terminal and to control or cut off a load drive power according to a gate control signal; and an overheat detection circuit that generates an overheat detection signal when it detects an overheat state of the drive circuit.

This invention also relates to an intelligent power module, which includes a power MOSFET as a drive circuit to drive a load according to a load drive instruction entered from an input terminal and to limit a load drive power according to a gate control signal; a temperature detection diode provided near the power MOSFET to detect the overheat state of the power MOSFET; and an overheat detection circuit having a comparator for generating an overheat detection signal upon detecting an overheat state.

(b) Description of the Prior Art

FIG. 5 is a circuit showing a conventional intelligent power module having an overheat protection function.

The conventional intelligent power switch circuit of this kind, as shown in FIG. 5, includes: a power MOSFET 5 which supplies electricity from a drain (in the figure, a terminal D; a source S is connected to a ground) connected to a battery (not shown) to a radio and car computers on board an automobile according to the load drive instruction entered from the input terminal (in the figure, a terminal G); a temperature detection circuit 1 that generates an overheat detection signal upon detecting the overheat state of the power MOSFET 5; a self-hold circuit 2 that generates a gate control signal to perform a protection control by deenergizing the power MOSFET 5 according to the overheat detection signal; and a gate cutoff circuit 3 that deenergizes the power MOSFET 5 by cutting off the load drive instruction supplied to the gate of the power MOSFET 5 according to a gate control signal.

FIG. 6 is a timing chart showing the operation of the overheat protection device in the intelligent power module of FIG. 5.

In the intelligent power switch circuit with the above configuration, when the temperature detection circuit 1 detects the overheat state of the power MOSFET 5 (i.e., the overheat detection signal in FIG. 6 changes from an OFF state to an ON state) while the power MOSFET 5 is supplying electricity to the load according to the load drive instruction (see Vout__1 or Vout__2 in FIG. 6), the self-hold circuit 2 generates a gate control signal according to the overheat detection signal to cause the gate cutoff circuit 3 to cut off, through an internal resistor 4 according to the gate control signal, the load drive instruction that is supplied to the gate of the power MOSFET 5, thus deenergizing the power MOSFET 5.

In more detail, as shown at Vout__1 of FIG. 6, the conventional intelligent power switch circuit performs the power control (i.e., switching control) to cut off the electricity supplied from the power MOSFET 5 (in the figure, Vout__1) according to the overheat detection signal (i.e., transition from OFF state to ON state).

In such a switching control, the cancel of the cut-off control state of the power Vout__1 is performed by the self-hold circuit 2 being reset when the load drive instruction (IN signal) changes from the OFF state to the ON stage again.

The conventional intelligent power switch circuit, as shown at Vout__2 of FIG. 6, performs a power control (i.e., power limit control) to limit electricity (in the figure, Vout__2) supplied from the power MOSFET 5 by turning it on and off according to the overheat detection signal that is generated (i.e., it changes from the OFF state to the ON state) when the temperature exceeds a predetermined temperature as a threshold.

Such a power limit control resets the limit control state of the power Vout__2 when the self-hold circuit 2 is reset by the transition of the overheat detection signal from the ON state to the OFF state.

However, such a conventional intelligent power module has the following technical problem. In the switching control, only after the load drive instruction (IN signal) changes its state from OFF state to ON state, is the self-hold circuit 2 reset to cancel the cutoff control state of the power Vout__1. Hence, if the overheat state is eliminated while the load drive instruction (IN signal) is ON, it is difficult to immediately execute the resetting of the cutoff control state.

When the ON state of the load drive instruction (IN signal) is maintained for a long period, in particular, even if the overheat state is eliminated during the ON state, the cutoff control state is maintained, making it difficult to execute the immediate resetting of the cutoff control state.

The power limit control of the conventional intelligent power module is performed by turning on and off the power Vout__2 supplied from the power MOSFET 5, with a predetermined overheat temperature used as a threshold, to limit the power Vout__2 until the self-hold circuit 2 is reset by the elimination of the overheat detection signal (i.e., transition from the ON state to the OFF state). Therefore, a problem arises in which the ON/OFF switching of the power Vout__2 during the time from the occurrence of the overheat detection signal to its resetting (i.e., the time during which the overheat detection signal changes from the OFF state to the ON state to the OFF state) causes thermal stresses in the power MOSFET 5.

This makes it difficult to perform immediate resetting of the power limit control state upon elimination of the overheat detection signal (i.e., transition from the ON state to the OFF state).

SUMMARY OF THE INVENTION

The present invention intends to solve these problems experienced by the conventional intelligent power module and its primary objective is to provide an overheat protection device, which monitors the energized state of the drive circuit that drives the load; resets the energized state when it detects the overheat state of the drive circuit during the energized state in order to limit or cut off the supply of electricity to the load; maintains the power limit control state or cutoff state; monitors the overheat state in synchronism with the timing signal having a predetermined cycle; and, when it detects the absence of the overheat state during the monitoring, generates a gate control signal to reset the power limit control state or power cutoff control state. It is also an object of this invention to provide a semiconductor switching apparatus and an intelligent power module, both using such an overheat protection device, so that, even during the ON state of the load drive instruction, it is possible to execute the immediate resetting of the power cutoff control state or the power limit control state upon detecting the elimination of the overheat state of the drive circuit (power MOSFET) provided in the semiconductor switching apparatus and the intelligent power module.

Another object of this invention is to utilize the ability to execute the immediate resetting of the power cutoff control state to allow the semiconductor switching apparatus and the intelligent power module to be controlled to the reset state without having to wait for the load drive instruction to change its state (i.e., from OFF state to ON state).

Still another object of this invention is to utilize the ability to execute the immediate resetting of the power limit control state to prevent excess thermal stresses from developing in the drive circuit (power MOSFET) due to the power limit control.

A further object of this invention is to utilize the ability to prevent excess thermal stresses to enhance the reliability of the drive circuit (power MOSFET).

A further object of this invention is to utilize the ability to execute the immediate resetting of the power limit control state to allow the semiconductor switching apparatus and the intelligent power module to be controlled to the reset state without having to wait for the load drive instruction to change its state (i.e., from ON state to OFF state).

In accordance with the first aspect of the present invention, there is provided an overheat protection device comprising: means for monitoring an energized state of a drive circuit used to drive a load; means for resetting the energized state to limit the supply of electricity to the load and holding the power limit control state, when an overheat state of the drive circuit is detected during the energized state; means for monitoring the overheat state in synchronism with a timing signal having a predetermined cycle; and means for generating a gate control signal to reset the power limit control state, when absence of the overheat state during the monitoring is detected (claim 1).

This configuration offers an advantage of being able to reset the power limit control state immediately after the overheat state of the drive circuit is eliminated.

The ability to execute the immediate resetting of the power limit control state makes it possible to prevent excess thermal stresses from being produced in the drive circuit due to the power limit control.

Because excess thermal stresses can be avoided, the reliability of the drive circuit can be enhanced.

Further, the ability to execute the immediate resetting of the power limit control state allows the drive circuit to be controlled to the reset state without having to wait for the load drive instruction to change its state.

The overheat protection device according to the first aspect further includes control means for generating the timing signal; a trigger generation circuit monitoring the overheat state in synchronism with the timing signal and, when it detects the absence of the overheat state during the monitoring, generating a reset signal to reset the power limit control state; and a gate signal generation circuit monitoring the energized state of the drive circuit, the gate signal generation circuit generating the gate control signal to reset the energized state to limit the supply of electricity to the load when the overheat state of the drive circuit is detected during the energized state, the gate signal generation circuit generating, in response to the reset signal, the gate control signal to reset the power limit control state in the driving of the load (claim 2).

This configuration further offers an advantage of being able to reset the power limit control state by using the gate control signal 108a synchronized with the reset signal 110a immediately after the overheat state of the drive circuit is eliminated.

Because the immediate resetting of the power limit control state can be executed in synchronism with the reset signal, excess thermal stresses that would otherwise be caused by the power limit control in the drive circuit can be avoided.

Further, the overheat protection device according to the first aspect preferably further includes means for generating a load drive instruction to energize a drive circuit to drive a load (claim 3).

This configuration offers an advantage of being able to drive the load and, when overheat state of the drive circuit is eliminated, hold and immediately reset the power limit control state.

Further, because the immediate resetting of the power limit control state can be executed, excess thermal stresses that would otherwise be caused in the drive circuit by the power limit control can be avoided. The ability to prevent excess thermal stresses results in an increased reliability of the drive circuit.

Further, because the immediate resetting of the power limit control state can be executed, the drive circuit can be controlled to the reset state by using the gate control signal synchronized with the timing signal without having to wait for the load drive instruction to change its state.

The overheat protection device according to the preceding configuration includes: control means for generating the load drive instruction and the timing signal; a trigger generation circuit monitoring the overheat state in synchronism with the timing signal and, when it detects the absence of the overheat state during the monitoring, generating a reset signal to reset the power limit control state; and a gate signal generation circuit monitoring the energized state of the drive circuit, the gate signal generation circuit generating the gate control signal to reset the energized state to limit the supply of electricity to the load when the overheat state of the drive circuit during the energized state is detected, the gate signal generation circuit generating, in response to the reset signal, the gate control signal to reset the power limit control state in the driving of the load. (claim 4).

This configuration further offers an advantage of being able to reset the power limit control state by using the gate control signal synchronized with the reset signal immediately after the overheat state of the drive circuit is eliminated.

The ability to execute the immediate resetting of the power limit control state in synchronism with the reset signal in turn prevents excess thermal stresses from being developed in the drive circuit due to the power limit control.

Further, in accordance with the second aspect of the present invention, there is provided an overheat protection device comprising: means for monitoring an energized state of a drive circuit used to drive a load; means for deenergizing the drive circuit to interrupt the supply of electricity to the load and holding the power cutoff control state, when an overheat state of the drive circuit during the energized state is detected; means for monitoring the overheat state in synchronism with a timing signal having a predetermined cycle; and means for generating a gate control signal to reset the power cutoff control state, when the absence of the overheat state during the monitoring is detected (claim 5).

This configuration offers an advantage of being able to execute the immediate resetting of the power cutoff control state when the overheat state of the drive circuit is eliminated.

The ability to execute the immediate resetting of the power cutoff control state makes it possible to prevent excess thermal stresses from developing in the drive circuit due to the power limit control.

The ability to prevent excess thermal stresses enhances the reliability of the drive circuit.

Further, because the power cutoff control state can be reset immediately, the drive circuit can be controlled to the reset state without having to wait for the load drive instruction to change its state.

The overheat protection device according to the preceding configuration includes: control means for generating the timing signal; trigger generation circuit monitoring the overheat state in synchronism with the timing signal and, when it detects the absence of the overheat state during the monitoring, generating a reset signal to reset the power cutoff control state; and a gate signal generation circuit monitoring the energized state of the drive circuit, the gate signal generation circuit generating the gate control signal to deenergize the drive circuit to interrupt the supply of electricity to the load when the overheat state of the drive circuit is detected during the energized state, the gate signal generation circuit generating, in response to the reset signal, the gate control signal to reset the power cutoff control state in the driving of the load (claim 6).

This configuration further offers an advantage of being able to execute the immediate resetting of the power cutoff control state by using the gate control signal synchronized with the reset signal when the overheat state of the drive circuit is eliminated.

The ability to execute the immediate resetting of the power cutoff control state in synchronism with the reset signal makes it possible to prevent excess thermal stresses from developing in the drive circuit due to the power limit control.

Further, the overheat protection circuit according to the second aspect of the present invention preferably further includes means for generating a load drive instruction to energize a drive circuit to drive a load (claim 7).

This configuration offers an advantage of being able to drive the load and, when the overheat state of the drive circuit is eliminated, execute the holding and the immediate resetting of the power cutoff control state.

The ability to execute the immediate resetting of the power cutoff control state can prevent excess thermal stresses from developing in the drive circuit due to the power cutoff control.

Because excess thermal stresses can be avoided, the reliability of the drive circuit can be enhanced.

Further, because the power cutoff control state can immediately be reset, the drive circuit can be controlled to the reset state by using the gate control signal synchronized with the timing signal without having to wait for the load drive instruction to change its state.

The overheat protection device according to the preceding configuration includes: control means for generating the load drive instruction and the timing signal; a trigger generation circuit monitoring the overheat state in synchronism with the timing signal and, when it detects the absence of the overheat state during the monitoring, generating a reset signal to reset the power cutoff control state; and a gate signal generation circuit monitoring the energized state of the drive circuit, the gate signal generation circuit generating the gate control signal to deenergize the drive circuit to interrupt the supply of electricity to the load when the overheat state of the drive circuit during the energized state is detected, the gate signal generation circuit generating, in response to the reset signal, the gate control signal to reset the power cutoff control state in the driving of the load (claim 8).

This configuration further offers an advantage of being able to execute the immediate resetting of the power cutoff control state by using the gate control signal synchronized with the reset signal when the overheat state of the drive circuit is eliminated.

The ability to execute the immediate resetting of the power cutoff control state in synchronism with the reset signal 110a in turn prevents excess thermal stresses from developing in the drive circuit due to the power cutoff control.

Further, in accordance with the third aspect of the present invention, there is provided a semiconductor switching apparatus using the overheat protection device according to the first aspect of the present invention, wherein the drive circuit serves to drive a load according to the load drive instruction supplied from an input terminal and controlling a load drive power according to the gate control signal; and wherein the overheat protection device is externally connected to the semiconductor switching apparatus through the input terminal, further comprising an overheat detection circuit for generating an overheat detection signal when an overheat state of the drive circuit is detected (claim 9).

The configuration further offers an advantage of being able to connect the overheat protection device as an external device to the semiconductor switching apparatus through an input terminal, so that the function of immediately resetting the power limit control state or the power cutoff control state when the overheat state of the drive circuit in the semiconductor switching apparatus is eliminated can be added virtually without causing any changes in the semiconductor switching apparatus.

Because the function of executing the immediate resetting of the power limit control state or the power cutoff control state is added to the semiconductor switching apparatus, it is also possible to add a function of preventing excess thermal stresses from developing in the drive circuit due to the power limit control or power cutoff control to the semiconductor switching apparatus virtually without causing any changes in the semiconductor switching apparatus.

The ability to prevent excess thermal stresses in turn enhances the reliability of the drive circuit in the semiconductor switching apparatus without causing any changes in the semiconductor switching apparatus.

Further, because the immediate resetting of the power limit control state or the power cutoff control state can be executed, the function of controlling the drive circuit to the reset state without waiting for the load drive instruction to change its state can be added to the semiconductor switching apparatus without causing any changes in the semiconductor switching apparatus.

Further, in accordance with the fourth aspect of the present invention, there is provided a semiconductor switching apparatus to drive a load using the overheat protection device according to the first aspect of the present invention, wherein the drive circuit for driving the load according to the load drive instruction and controlling a load drive power according to the gate control signal, further comprising: an overheat detection circuit for generating an overheat detection signal when an overheat state of the drive circuit is detected (claim 10).

This configuration further offers an advantage of being able to integrate the overheat protection device into the semiconductor switching apparatus and thereby to add to the semiconductor switching apparatus virtually without having to expand the equipment size (the scale of the circuit) a function of executing the immediate resetting of the power limit control state or the power cutoff control state when the overheat state of the drive circuit in the semiconductor switching apparatus is eliminated.

Because the function of executing the immediate resetting of the power limit control state or the power cutoff control state is integrated into the semiconductor switching apparatus, it is possible to add to the semiconductor switching apparatus virtually without increasing the equipment size (the scale of the circuit) a function of preventing excess thermal stresses from developing in the drive circuit due to the power limit control or the power cutoff control.

Because the function of preventing excess thermal stresses can be integrated into the semiconductor switching apparatus, it is possible to enhance the reliability of the drive circuit in the semiconductor switching apparatus virtually without increasing the equipment size (the scale of the circuit) of the semiconductor switching apparatus.

Further, because the function of executing the immediate resetting of the power limit control state or the power cutoff control state can be integrated into the semiconductor switching apparatus, a function of controlling the drive circuit to the reset state without having to wait for the load drive instruction to change its stage can be added to the semiconductor switching apparatus virtually without causing any changes in the semiconductor switching apparatus.

The semiconductor switching apparatus according to the third or fourth aspect of the present invention includes a MOS transistor whose drain and source are connected between the gate of a power MOSFET and the ground, with the gate of the MOS transistor supplied with the gate control signal, wherein the MOS transistor limits the transmission of the load drive instruction to the power MOSFET according to the gate control signal to limit a load drive power supplied to the power MOSFET (claims 11 and 12).

This configuration further offers an advantage of being able to add to the semiconductor switching apparatus virtually without causing changes in the semiconductor switching apparatus a function of executing the immediate resetting of the power limit control state or the power cutoff control state when the overheat state is eliminated from the power MOSFET in the semiconductor switching apparatus, which is connected through an input terminal with the overheat protection device as an external device.

Because the function of executing the immediate resetting of the power limit control state or the power cutoff control state can be added to the semiconductor switching apparatus, a function of preventing excess thermal stresses in the power MOSFET due to the power limit control or the power cutoff control can be added to the semiconductor switching apparatus virtually without causing any changes in the semiconductor switching apparatus.

The ability to prevent excess thermal stresses in turn enhances the reliability of the power MOSFET in the semiconductor switching apparatus without causing any changes in the semiconductor switching apparatus Further, the ability to execute the immediate resetting of the power limit control state or the power cutoff control state makes it possible to add to the semiconductor switching apparatus virtually without causing any changes in the semiconductor switching apparatus a function of controlling the power MOSFET 18 to the reset state without having to wait for the load drive instruction to change its state.

Integration of the overheat protection device into the semiconductor switching apparatus offers the advantage that when the overheat state of the power MOSFET in the semiconductor switching apparatus is eliminated, the function of executing the immediate resetting of the power limit control state or the power cutoff control state can be added to the semiconductor switching apparatus virtually without expanding the equipment size (the scale of the circuit) of the semiconductor switching apparatus. Because the function of executing the immediate resetting of the power limit control state or the power cutoff control state is integrated into the semiconductor switching apparatus, a function of preventing excess thermal stresses from developing in the power MOSFET due to the power limit control or the power cutoff control can be added to the semiconductor switching apparatus virtually without increasing the equipment size (the scale of the circuit) of the semiconductor switching apparatus. Because the function of preventing excess thermal stresses can be integrated into the semiconductor switching apparatus, it is possible to enhance the reliability of the power MOSFET in the semiconductor switching apparatus virtually without expanding the equipment size (the scale of the circuit) of the semiconductor switching apparatus. Further, the ability, integrated into the semiconductor switching apparatus, to execute the immediate resetting of the power limit control state or the power cutoff control state allows the addition to the semiconductor switching apparatus virtually without causing any changes in the semiconductor switching apparatus a function of controlling the power MOSFET to the reset state without having to wait for the load drive instruction to change its state.

In accordance with the fifth aspect of the present invention, there is provided an intelligent power module using the overheat protection device according to the first aspect of the present invention, comprising: a power MOSFET as the drive circuit for driving the load according to the load drive instruction supplied through an input terminal and for limiting or interrupting a load drive power according to the gate control signal; and an overheat detection circuit having a temperature detection diode provided near the power MOSFET to detect an overheat state of the power MOSFET, and a comparator to generate an overheat detection signal when the overheat state is detected; wherein the overheat protection device is externally connected to the intelligent power module through the input terminal (claim 13).

This configuration offers an advantage of being able to add to the intelligent power module virtually without causing any changes in the intelligent power module a function of executing the immediate resetting of the power limit control state or the power cutoff control state when the overheat state is eliminated from the power MOSFET in the intelligent power module which is connected through an input terminal with the overheat protection device as an external device.

The function, added to the intelligent power module, of executing the immediate resetting of the power limit control state or the power cutoff control state can prevent excess thermal stresses from developing in the power MOSFET due to the power limit control or the power cutoff control virtually without causing any changes in the intelligent power module.

Because excess thermal stresses can be prevented, it is possible to enhance the reliability of the power MOSFET in the intelligent power module without causing any changes in the intelligent power module.

Further, the ability to execute the immediate resetting of the power limit control state or the power cutoff control state in turn allows the addition, to the intelligent power module virtually without causing any changes in the intelligent power module, of a function of controlling the power MOSFET to the reset state without having to wait for the load drive instruction to change its state.

Further, in accordance with the sixth aspect of the present invention, there is provided an intelligent power module adapted to drive a load using the overheat protection device according to the first aspect of the present invention, comprising: a power MOSFET as the drive circuit to drive the load according to the load drive instruction and to limit a load drive power according to the gate control signal; and an overheat detection circuit having a temperature detection diode provided near the power MOSFET to detect an overheat state of the power MOSFET, and a comparator to generate an overheat detection signal when the overheat state is detected (claim 14).

This configuration offers an advantage of being able to integrate the overheat protection device into the intelligent power module and thereby add to the intelligent power module virtually without expanding the equipment size (the scale of the circuit) a function of executing the immediate resetting of the power limit control state or the power cutoff control state when the overheat state of the power MOSFET in the intelligent power module is eliminated. Further, because the function of executing the immediate resetting of the power limit control state or the power cutoff control state is integrated into the intelligent power module, a function of preventing excess thermal stresses from developing in the power MOSFET 18 due to the power limit control or the power cutoff control can be added to the intelligent power module virtually without increasing the equipment size (the scale of the circuit). The ability, integrated into the intelligent power module, to prevent excess thermal stresses can enhance the reliability of the power MOSFET in the intelligent power module virtually without entailing an increase in the equipment size (the scale of the circuit). Further, because the function of executing the immediate resetting of the power limit control state or the power cutoff control state can be integrated into the intelligent power module, a function of controlling the power MOSFET to the reset state without having to wait for the load drive instruction to change its state can be added to the intelligent power module virtually without causing any changes in the intelligent power module.

The intelligent power module according to the fifth or sixth aspect of the present invention includes a MOS transistor whose drain and source are connected between the gate of the power MOSFET and the ground, with the gate of the MOS transistor supplied with the gate control signal, wherein the MOS transistor limits the transmission of the load drive instruction to the power MOSFET according to the gate control signal to limit a load drive power supplied to the power MOSFET (claims 15 and 16).

This configuration further provides an advantage of being able to add to the intelligent power module virtually without causing any changes in the intelligent power module a function of executing the immediate resetting of the power limit control state or the power cutoff control state at high speed and with high reproducibility by controlling the gate of the MOS transistor when the overheat state is eliminated from the power MOSFET in the intelligent power module which is connected through an input terminal with the overheat protection device as an external device.

Because the function of executing the immediate resetting of the power limit control state or the power cutoff control state at high speed and with high reproducibility by controlling the gate of the MOS transistor is added to the intelligent power module, a function of preventing excess thermal stresses from developing in the power MOSFET due to the power limit control or the power cutoff control can be added to the intelligent power module virtually without causing any changes in the intelligent power module.

The ability to prevent excess thermal stresses in turn enhances the reliability of the power MOSFET in the intelligent power module without causing any changes in the intelligent power module.

Further, the ability to execute the immediate resetting of the power limit control state or the power cutoff control state at high speed and with high reproducibility by controlling the gate of the MOS transistor makes it possible to add to the intelligent power module virtually without causing any changes in the intelligent power module a function of controlling the power MOSFET to the reset state without having to wait for the load drive instruction to change its state.

With the overheat protection device integrated into the intelligent power module, a function of executing the immediate resetting of the power limit control state or the power cutoff control state at high speed and with high reproducibility by controlling the gate of the MOS transistor can be added to the intelligent power module virtually without increasing the equipment size (the scale of the circuit). Because the function of executing the immediate resetting of the power limit control state or the power cutoff control state at high speed and with high reproducibility by controlling the gate of the MOS transistor is integrated into the intelligent power module, a function of preventing excess thermal stresses from developing in the power MOSFET 18 due to the power limit control or the power cutoff control can be added to the intelligent power module virtually without entailing an increase in the equipment size (the scale of the circuit).

Because the function of preventing the generation of excess thermal stresses can be integrated into the intelligent power module, the reliability of the power MOSFET 18 in the intelligent power module can be enhanced virtually without expanding the equipment size (the scale of the circuit). Further, because the function of executing the immediate resetting of the power limit control state or the power cutoff control state at high speed and with high reproducibility by controlling the gate of the MOS transistor can be integrated into the intelligent power module, a function of controlling the power MOSFET to the reset state without having to wait for the load drive instruction to change its state can be added to the intelligent power module virtually without causing any changes in the intelligent power module.

The above and other objects and features of the present invention will be more apparent from the following description taken in conjunction with the accompanying drawings.

DESCRIPTION OF THE PREFERRED EMBODIMENT

Now, one embodiment of this invention will be described by referring to the accompanying drawings.

First, let us explain about the overheat protection device 10 with reference to the drawings.

Figure 1:
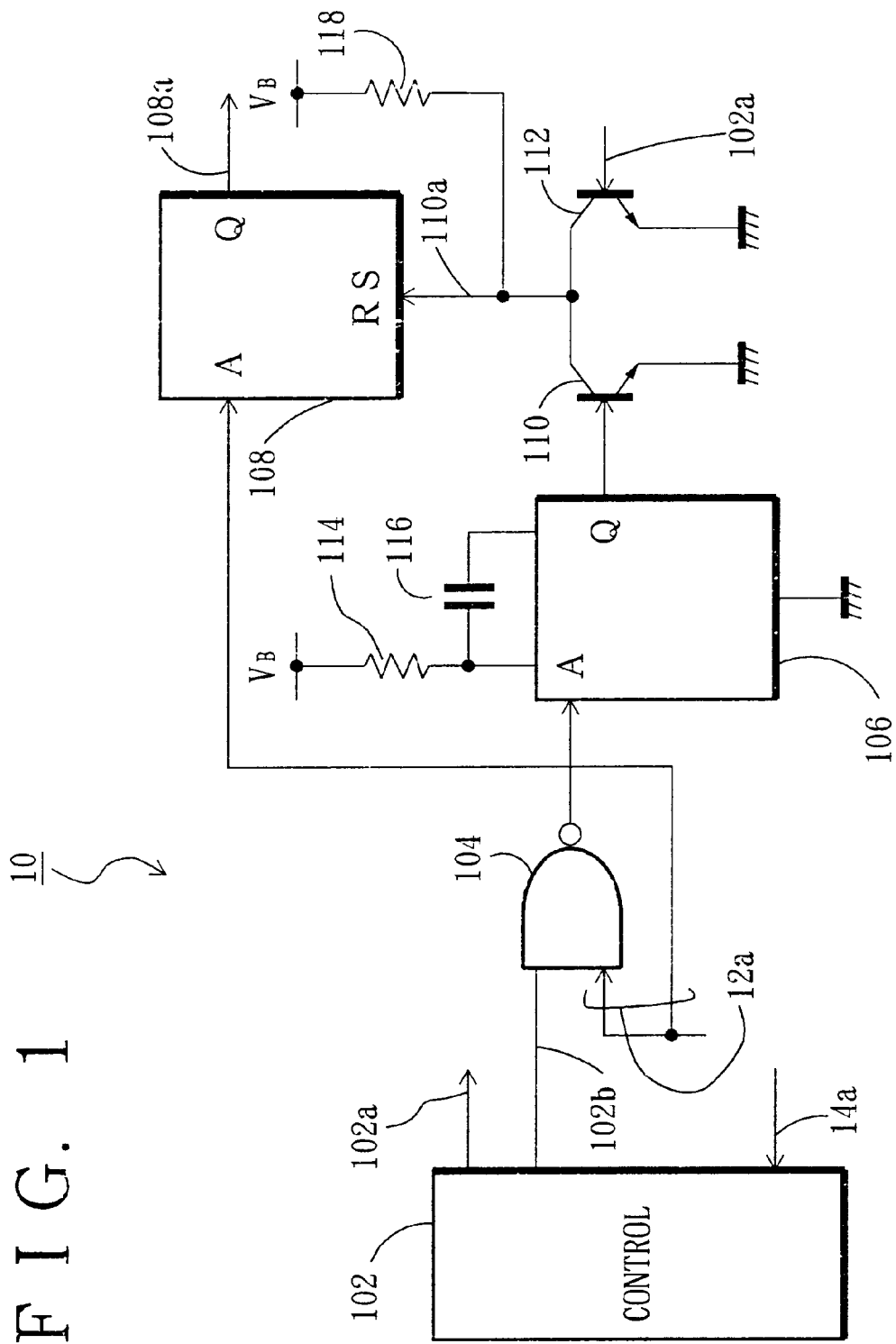
FIG. 1 is a circuit diagram showing one embodiment of an overheat protection device of this invention.

FIG. 1 is a circuit diagram showing one embodiment of the overheat protection device 10 of this invention.

The overheat protection device 10 has functions of generating a load drive instruction 102a for energizing a drive circuit to drive a load 32; monitoring the energized state of the drive circuit and, when it detects an overheat state of the drive circuit during the energized state, canceling the energized state of the drive circuit to limit the supply of electricity to the load; holding the power limit control state; monitoring the overheat state in synchronism with a timing signal 102b having a predetermined cycle; and, when it detects the absence of the overheat state, generating a gate control signal 108a to cancel the power limit control state.

The overheat protection device 10 also has functions of generating the load drive instruction 102a for energizing the drive circuit to drive the load 32; monitoring the energized state of the drive circuit and, when it detects an overheat state of the drive circuit during the energized state, deenergizing the drive circuit to cut off the supply of electricity to the load 32; holding the power cutoff control state; monitoring the overheat state in synchronism with the timing signal 102b having a predetermined cycle; and, when it detects the absence of the overheat state, generating the gate control signal 108a to cancel the power cutoff control state.

To realize such functions, the overheat protection device 10 has a control means 102 and a gate signal generation circuit 108, as shown in FIG. 1.

The control means 102 has a function of generating a load drive instruction 102a and a timing signal 102b.

The control means 102 has functions of limiting the supply of electricity to the load by canceling the energized state of the drive circuit when it receives an overcurrent detection signal 14a which an overcurrent detection circuit 14 generates upon detecting an overcurrent flowing through the load 32; holding the power limit control state; monitoring the overheat state of the load 32 in synchronism with the timing signal 102b having a predetermined cycle by using the overcurrent detection signal 14a; and, when it detects the absence of the overheat state, generating a gate control signal 108a to cancel the power limit control state.

Similarly, the control means 102 has functions of cutting off the supply of electricity to the load by deenergizing the drive circuit when it receives the overcurrent detection signal 14a; holding the power cutoff control state; monitoring the overheat state of the load 32 in synchronism with the timing signal 102b having a predetermined cycle by using the overcurrent detection signal 14a; and, when it detects the absence of the overheat state, generating the gate control signal 108a to cancel the power cutoff control state.

The control means 102 having such functions is preferably realized by using a CPU.

Trigger generation circuits 110, 112 have functions of monitoring the overheat state in synchronism with the timing signal 102b; and, when they detect the absence of the overheat state, generating a reset signal 110a to cancel the power limit control state.

The trigger signal generation circuits 110, 112 also have functions of monitoring the overheat state in synchronism with the timing signal 102b; and, when they detect the absence of the overheat state, generating the reset signal 110a to cancel the power cutoff control state.

The trigger signal generation circuits 110, 112 with such functions are preferably realized by npn transistors 110, 112 which form a differential circuit having their emitters commonly grounded and collectors commonly connected to a reset terminal (RS terminal described later) of the gate signal generation circuit 108.

The synchronizing with the timing signal 102b is performed, as shown in FIG. 1, by performing the NAND operation on the timing signal 102b and the overheat detection signal 12a by using a logic element (NAND gate) 104, supplying the result of NAND operation to an input terminal A of a one-shot trigger circuit 106, outputting from an output terminal Q a trigger pulse having a pulse width determined by a resistor element 114 and a capacitor 116, and then supplying the trigger pulse to the base of the npn transistor 110.

The base of the npn transistor 112 can be supplied with the load drive instruction 102a from the control means 102.

The gate signal generation circuit 108 has functions of monitoring the energized state of the drive circuit; when it detects an overheat state of the drive circuit during the energized state, generating a gate control signal 108a to cancel the energized state and limit a supply of electricity to the load 32; and, according to the reset signal 110a, generating a gate control signal 108a to cancel the power limit control state in the driving of the load 32.

The gate signal generation circuit 108 also has functions of monitoring the energized state of the drive circuit; when it detects an overheat state of the drive circuit during the energized state, generating a gate control signal 108a to cancel the energized state and cut off the supply of electricity to the load 32; and, according to the reset signal 110a, generating a gate control signal 108a to cancel the power cutoff control state in the driving of the load 32.

The gate signal generation circuit 108 with such functions should preferably be realized by using a D flip-flop or a J–K flip-flop having a reset function, as shown in FIG. 1.

In this case, as shown in FIG. 1, the input terminal A of the gate signal generation circuit 108 is supplied with the overheat detection signal 12a from an overheat detection circuit 12, the reset input terminal RS is supplied with a reset signal 110a from the trigger signal generation circuits 110, 112, and the output terminal Q outputs the gate control signal 108a for use in the power limit control or power cutoff control.

The provision of the control means 102 and gate signal generation circuit 108 with these functions makes it possible, when the overheat state of the drive circuit is reset, to immediately cancel the power limit control state by using the gate control signal 108a synchronized with the reset signal 110a.

Because the immediate resetting of the power limit control state in synchronism with the reset signal 110a is realized, it is possible to prevent generation of an excess thermal stress in the drive circuit that would otherwise be caused by the power limit control.

As described above, the overheat protection device 10 in its power limit control function can drive the load 32 and, when the overheat state of the drive circuit is eliminated, can hold or immediately reset the power limit control state.

Because the immediate resetting of the power limit control state can be executed, it is possible to prevent excess thermal stresses in the drive circuit that would otherwise be caused by the power limit control. That is, since excess thermal stresses can be avoided, the reliability of the drive circuit can be enhanced.

Further, the ability to perform the immediate resetting of the power limit control state allows the overheat protection device 10 to control the drive circuit to the reset state by using the gate control signal 108a synchronized with the timing signal 102b without having to wait for the load drive instruction 102a to change its state.

Further, in the power cutoff control function, when the overheat state of the drive circuit is eliminated, the overheat protection device 10 can perform an immediate resetting of the power cutoff control state.

Further, the ability to perform the immediate resetting of the power cutoff control state allows for preventing excess thermal stresses in the drive circuit that would otherwise be caused by the power limit control. Because excess thermal stresses can be avoided, the reliability of the drive circuit can be enhanced.

Furthermore, the ability to perform the immediate resetting of the power cutoff control state allows the overheat protection device 10 to control the drive circuit to the reset state without having to wait for the load drive instruction 102a to change its state.

Next, an embodiment of the intelligent power module 30 using the overheat protection device 10 will be described by referring to the drawings.

Figure 2:
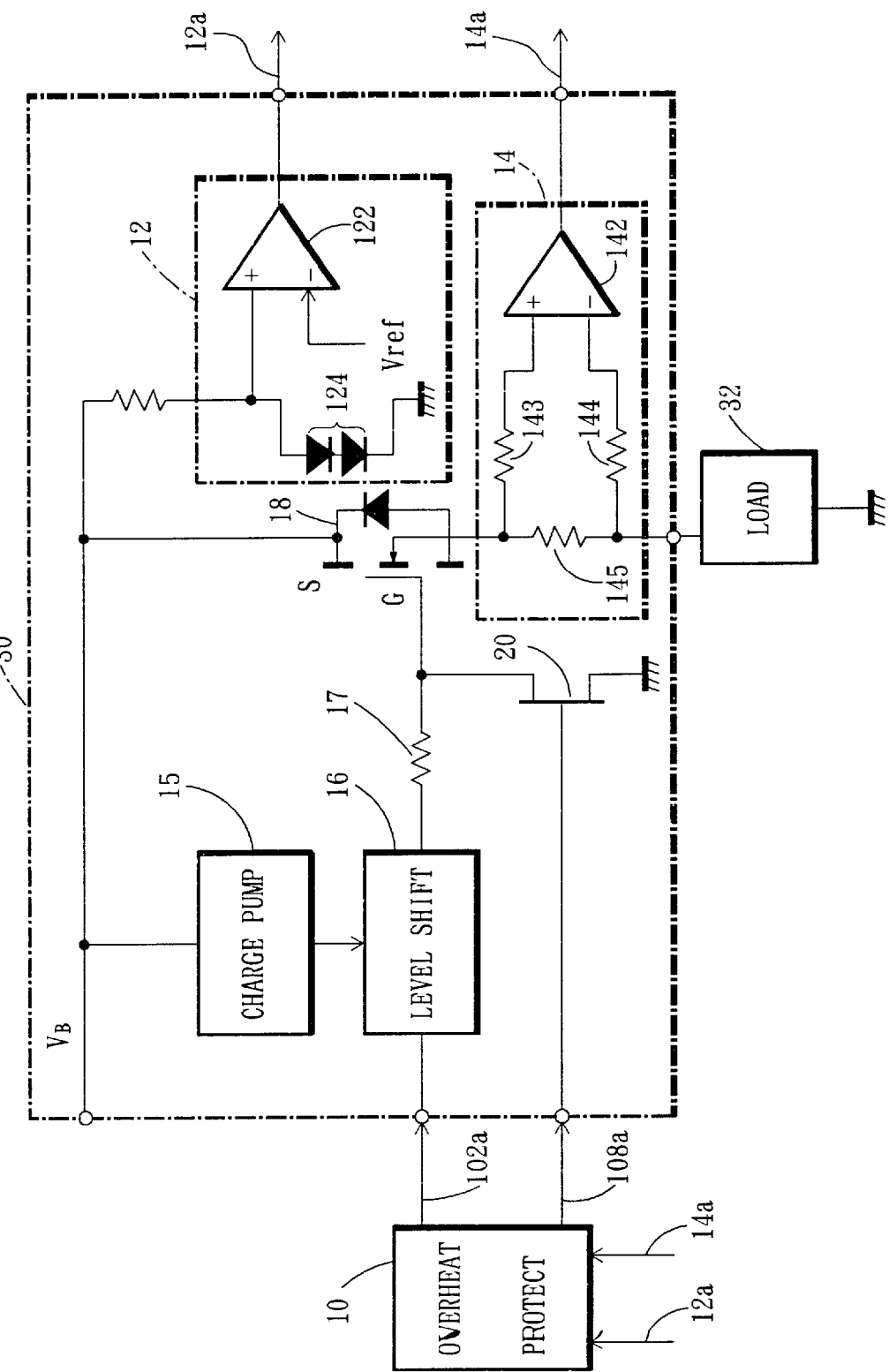
FIG. 2 is a circuit diagram showing one embodiment of an intelligent power module using the overheat protection device of FIG. 1.

FIG. 2 is a circuit diagram showing one embodiment of the intelligent power module 30, one form of a semiconductor switching apparatus 40 using the overheat protection device 10 of FIG. 1.

The intelligent power module 30 in this embodiment has a power MOSFET 18, which is a drive circuit to drive the load 32 according to the load drive instruction 102a entered from the input terminal and to limit or cut off a load drive power according to the gate control signal 108a; a temperature detection diode 124 provided near the power MOSFET 18 to detect the overheat state of the power MOSFET 18; and an overheat detection circuit 12 having a comparator 122 to generate an overheat detection signal 12a upon detecting the overheat state. The intelligent power module 30 is also characterized in that it is connected at its input terminal with the overheat protection device 10 as an external device.

The intelligent power module 30 performs control according to an instruction from on-board computers to interrupt electric power supplied to the load 32, particularly a radio or car computers on board a vehicle such as an automobile, through a power line connected to a battery.

The car computers include an air conditioning computer, a closed control computer, a traction control computer, an antilock brake computer, a navigation computer, and an engine control computer.

The intelligent power module 30, as shown in FIG. 2, includes the overheat protection device 10, power MOSFET 18, overheat detection circuit 12, overcurrent detection circuit 14, charge pump circuit 15, level shifter 16 and MOS transistor 20.

Because the overheat protection device 10 can be integrated into the intelligent power module 30, the function to immediately reset the power cutoff control state as soon as the overheat state of the power MOSFET 18 in the intelligent power module 30 is eliminated can be added virtually without increasing the equipment size (the scale of the circuit). Further, the integration into the intelligent power module 30 of the function of immediately resetting the power cutoff control state in turn allows a function of preventing excess thermal stresses in the power MOSFET 18, which would otherwise be caused by the power cutoff control, to be added in the intelligent power module 30 virtually without increasing the equipment size (the scale of the circuit). That is, since the function of preventing excess thermal stresses can be integrated in the intelligent power module 30, the reliability of the power MOSFET 18 in the intelligent power module 30 can be enhanced, virtually without increasing the equipment size (the scale of the circuit). Further, the integration into the intelligent power module 30 of the function of immediately resetting the power cutoff control state in turn allows a function, which controls the power MOSFET 18 to the reset state without having to wait for the load drive instruction 102a to change its state, to be added to the intelligent power module 30 virtually without causing changes in the intelligent power module 30.

The detail of the configuration of the intelligent power module 30 will be explained.

The power MOSFET 18 functions as a drive circuit that drives the load 32 according to the load drive instruction 102a and limits or interrupts the load drive power according to the gate control signal 108a. In this embodiment, an n-channel power MOSFET is preferably used as shown in FIG. 2.

The overheat detection circuit 12 has a temperature detection diode 124 provided near the power MOSFET 18 to check for the overheat state of the power MOSFET 18 and a comparator 122 to generate an overheat detection signal 12a upon detecting the overheat state.

The overcurrent detection circuit 14 has a resistor element 145 serially connected between the drain of the power MOSFET 18 and the load 32 to detect the overcurrent state of the load 32, and a comparator 142 that detects a voltage produced in the resistor element 145 through resistor elements 143, 144 and, when it finds an overload state, generates an overcurrent detection signal 14a.

The cycle of the timing signal 102b is preferably determined based on the overcurrent state sampling cycle used by the overcurrent detection circuit 14. In more concrete terms, assuming that the overcurrent state sampling cycle of the overcurrent detection circuit 14 is 5 ms, the cycle of the timing signal 102b is preferably set, for example, to 20 ms, which is greater than the sampling period of the overcurrent detection circuit 14.

The MOS transistor 20 has its drain and source connected between the gate of the power MOSFET 18 and the ground, with its gate connected with the gate control signal 108a, and limits or interrupts the transfer of the load drive instruction 102a to the power MOSFET 18 according to the gate control signal 108a to limit or interrupt the load drive power of the power MOSFET 18.

Where the overheat protection device 10 is integrated into the intelligent power module 30, when the overheat state of the power MOSFET 18 in the intelligent power module 30 is eliminated, the gate control of the MOS transistor 20 with the above function makes it possible to add to the intelligent power module 30 a function, which executes the immediate resetting of the power cutoff control state quickly and with high reproducibility virtually without increasing the equipment size (the scale of the circuit).

A supply voltage $V_B$ raised by the charge pump circuit 15 (i.e., a supply voltage of battery (normally 12 [Vdc])) is converted through the load drive instruction 102a and the level shifter 16 into a predetermined signal level, which is then sent to the gate of the MOS transistor 20 through the a resistor element 17.

In more detail, the charge pump circuit 15 raises the supply voltage of the battery (12 [Vdc]) to an elevated voltage of about 25 [Vdc].

Next, by referring to the drawings, we will explain about the operation of the overheat protection device 10 and the intelligent power module 30.

Figure 3:
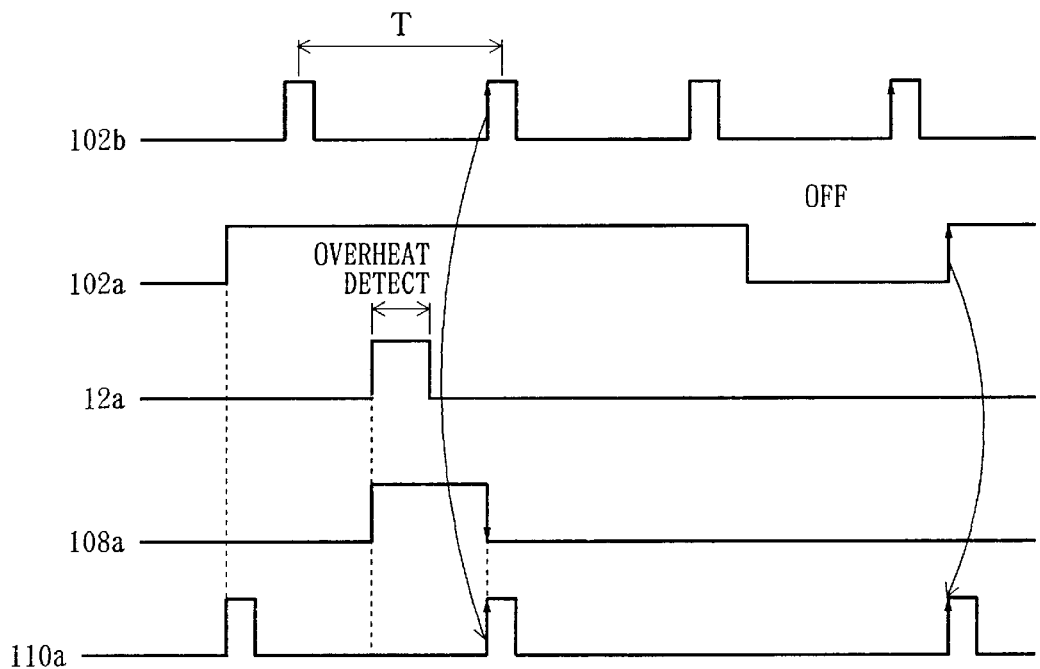
FIG. 3 is a timing chart showing the operation of the intelligent power module of FIG. 2 when the overheat state is short.
Figure 4:
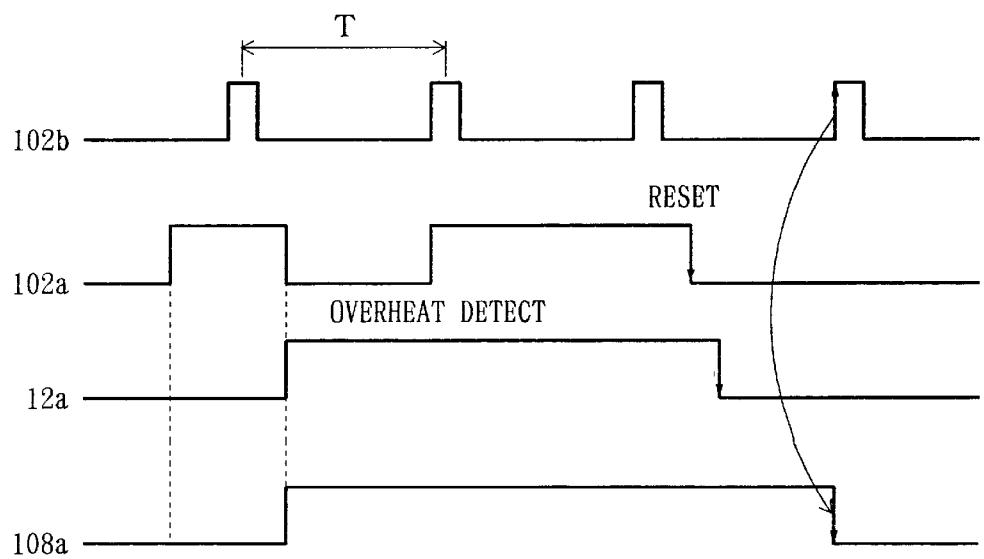
FIG. 4 is a timing chart showing the operation of the intelligent power module of FIG. 2 when the overheat state is long.
Figure 5:
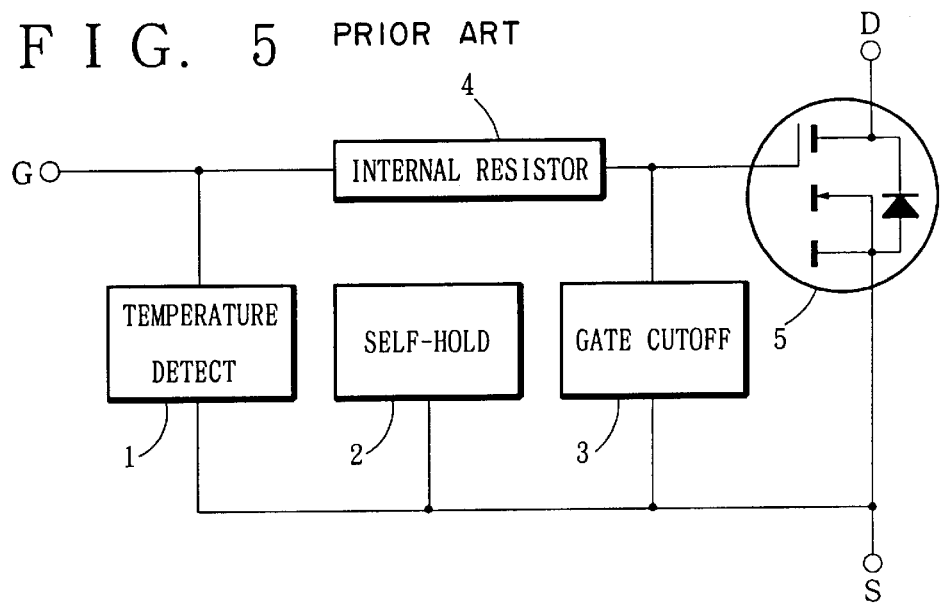
FIG. 5 is a circuit diagram showing a conventional overheat protection device and the intelligent power module using the conventional overheat protection device.
Figure 6:
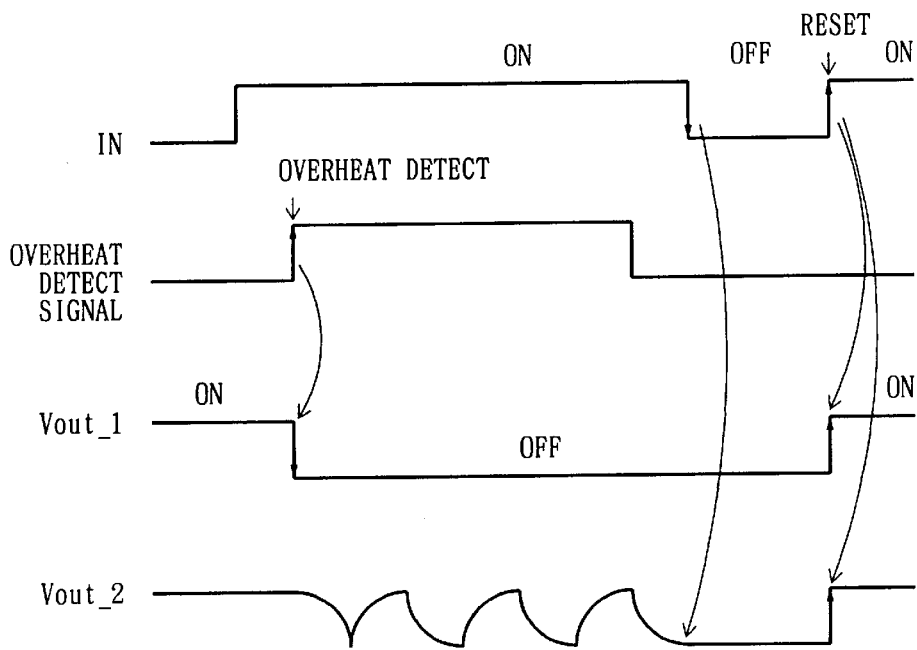
FIG. 6 is a timing chart showing the operation of the overheat protection device in the intelligent power module of FIG. 5.

FIG. 3 is a timing chart showing the operation of the intelligent power module 30 of FIG. 2 when the overheat state of the intelligent power module 30 is short. FIG. 4 is a timing chart showing the operation of the intelligent power module 30 of FIG. 2 when the overheat state of the intelligent power module 30 is long.

The overheat protection device 10 monitors the energized state of the power MOSFET 18 and, when it detects the overheat state of the power MOSFET 18 during the energized state, turns the power MOSFET 18 into the deenergized state to cut off power to the load 32, as shown in FIGS. 3 and 4. When it detects the absence of the overheat state, the overheat protection device 10 generates the gate control signal 108a to reset the power cutoff control state.

When the overheat state is short as shown in FIG. 3, in particular, the reset signal 110a is produced in synchronism with the timing signal 102b immediately after detecting the elimination of the overheat state of the power MOSFET 18. In synchronism with this reset signal 110a the power cutoff control state is reset.

When the overheat state is long, as shown in FIG. 4, the overheat detection state is reset in synchronism with the transition of the load drive instruction 102a to OFF state, i.e., the overheat detection signal 12a changes from ON state to OFF state. In synchronism with the timing signal 102b immediately after the state transition of the overheat detection signal 12a, a reset signal 110a is generated, and the power cutoff control state is reset in synchronism with this reset signal 110a.

As described above, with the overheat protection device 10 connected as an external device to the intelligent power module 30 through an input terminal, a function of immediately resetting the power cutoff control state when the overheat state of the power MOSFET 18 in the intelligent power module 30 is eliminated can be added to the intelligent power module 30 virtually without causing changes in the intelligent power module 30.

Because the function of executing the immediate resetting of the power cutoff control state is added to the intelligent power module 30, it is possible to incorporate a function of preventing excess thermal stresses in the power MOSFET 18, which would otherwise be caused by the power cutoff control, into the intelligent power module 30 virtually without causing changes in the intelligent power module 30.

With excess thermal stresses avoided, the reliability of the power MOSFET 18 in the intelligent power module 30 can be enhanced. This advantage is realized without causing any changes in the intelligent power module 30.

Further, because the power cutoff control state can be reset immediately, a function of controlling the power MOSFET 18 to the reset state without having to wait for the load drive instruction 102a to change its state can be added to the intelligent power module 30 virtually without causing changes in the intelligent power module 30.

We claim:

1. An overheat protection device comprising:
   means for monitoring an energized state of a drive circuit used to drive a load;
   means for resetting the energized state to limit the supply of electricity to the load and holding a power limit control state, when an overheat state of the drive circuit is detected during the energized state;
   means for monitoring the overheat state in synchronism with a periodic timing signal having a predetermined cycle; and
   means for generating a gate control signal to reset the power limit control state, when absence of the overheat state during the monitoring is detected.

2. An overheat protection device according to claim 1, further comprising:
   control means for generating the timing signal;
   a trigger generation circuit monitoring the overheat state in synchronism with the timing signal and, when it detects the absence of the overheat state during the monitoring, generating a reset signal to reset the power limit control state; and
   a gate signal generation circuit monitoring the energized state of the drive circuit, the gate signal generation circuit generating the gate control signal to reset the energized state to limit the supply of electricity to the load when the overheat state of the drive circuit is detected during the energized state, the gate signal generation circuit generating, in response to the reset signal, the gate control signal to reset the power limit control state in the driving of the load.

3. An overheat protection device according to claim 1, further comprising means for generating a load drive instruction to energize a drive circuit to drive a load.

4. An overheat protection device according to claim 3 further comprising:
   control means for generating the load drive instruction and the timing signal;
   a trigger generation circuit monitoring the overheat state in synchronism with the timing signal and, when it detects the absence of the overheat state during the monitoring, generating a reset signal to reset the power limit control state; and
   a gate signal generation circuit monitoring the energized state of the drive circuit, the gate signal generation circuit generating the gate control signal to reset the energized state to limit the supply of electricity to the load when the overheat state of the drive circuit during the energized state is detected, the gate signal generation circuit generating, in response to the reset signal, the gate control signal to reset the power limit control state in the driving of the load.

5. A semiconductor switching apparatus using the overheat protection device according to claim 3, wherein said drive circuit serves to drive a load according to the load drive instruction supplied from an input terminal and controlling a load drive power according to the gate control signal; and wherein the overheat protection device is externally connected to the semiconductor switching apparatus through the input terminal, further comprising an overheat detection circuit for generating an overheat detection signal when an overheat state of the drive circuit is detected.

6. A semiconductor switching apparatus to drive a load using the overheat protection device according to claim 3, wherein said drive circuit for driving the load according to the load drive instruction and controlling a load drive power according to the gate control signal, further comprising:

an overheat detection circuit for generating an overheat detection signal when an overheat state of the drive circuit is detected.

7. A semiconductor switching apparatus according to claim 5, comprising a MOS transistor whose drain and source are connected between the gate of a power MOSFET and the ground, with the gate of the MOS transistor supplied with the gate control signal, wherein the MOS transistor limits the transmission of the load drive instruction to the power MOSFET according to the gate control signal to limit a load drive power supplied to the power MOSFET.

8. A semiconductor switching apparatus according to claim 6, comprising a MOS transistor whose drain and source are connected between the gate of a power MOSFET and the ground, with the gate of the MOS transistor supplied with the gate control signal, wherein the MOS transistor limits the transmission of the load drive instruction to the power MOSFET according to the gate control signal to limit a load drive power supplied to the power MOSFET.

9. An intelligent power module using the overheat protection device according to claim 3, comprising:

a power MOSFET as the drive circuit for driving the load according to the load drive instruction supplied through an input terminal and for limiting or interrupting a load drive power according to the gate control signal; and an overheat detection circuit having a temperature detection diode provided near the power MOSFET to detect an overheat state of the power MOSFET, and a comparator to generate an overheat detection signal when the overheat state is detected;

wherein the overheat protection device is externally connected to the intelligent power module through the input terminal.

10. An intelligent power module according to claim 9, including a MOS transistor whose drain and source are connected between the gate of the power MOSFET and the ground, with the gate of the MOS transistor supplied with the gate control signal, wherein the MOS transistor limits the transmission of the load drive instruction to the power MOSFET according to the gate control signal to limit a load drive power supplied to the power MOSFET.

11. An intelligent power module adapted to drive a load using the overheat protection device according to claim 3, comprising:

a power MOSFET as the drive circuit to drive the load according to the load drive instruction and to limit a load drive power according to the gate control signal; and an overheat detection circuit having a temperature detection diode provided near the power MOSFET to detect an overheat state of the power MOSFET, and a comparator to generate an overheat detection signal when the overheat state is detected.

12. An intelligent power module according to claim 11, including a MOS transistor whose drain and source are connected between the gate of the power MOSFET and the ground, with the gate of the MOS transistor supplied with the gate control signal, wherein the MOS transistor limits the transmission of the load drive instruction to the power MOSFET according to the gate control signal to limit a load drive power supplied to the power MOSFET.

13. An overheat protection device comprising:

means for monitoring an energized state of a drive circuit used to drive a load;

means for deenergizing the drive circuit to interrupt the supply of electricity to load and holding a power cutoff control state, when an overheat state of the drive circuit during the energized state is detected;

means for monitoring the overheat state in synchronism with a periodic timing signal having a predetermined cycle; and means for generating a gate control to reset the power cutoff control state, when the absence of the overheat state during the monitoring is detected.

14. An overheat protection device according to claim 13, comprising:

control means for generating the timing signal;

a trigger generation circuit monitoring the overheat state in synchronism with the timing signal and, when it detects the absence of the overheat state during the monitoring, generating a reset signal to reset the power cutoff control state; and a gate signal generation circuit monitoring the energized state of the drive circuit, the gate signal generation circuit generating the gate control signal to deenergize the drive circuit to interrupt the supply of electricity to the load when the overheat state of the drive circuit is detected during the energized state, the gate signal generation circuit generating, in response to the reset signal, the gate control signal to reset the power cutoff control state in the driving of the load.

15. An overheat protection device according to claim 13, further comprising means for monitoring a load drive instruction to energize a drive circuit to drive a load.

16. An overheat protection device according to claim 15 further comprising:

control means for generating the load drive instruction and the timing signal;

a trigger generation circuit monitoring the overheat state in synchronism with the timing signal and, when it detects the absence of the overheat state during the monitoring, generating a reset signal to reset the power cutoff control state; and a gate signal generation circuit monitoring the energized state of the drive circuit, the gate signal generation circuit generating the gate control signal to deenergize the drive circuit to interrupt the supply of electricity to the load when the overheat state of the drive circuit during the energized state is detected, the gate signal generation circuit generating, in response to the reset signal, the gate control signal to reset the power cutoff control state in the driving of the load.

* * * * *